(12) United States Patent
Sandoval et al.

(10) Patent No.: US 7,112,069 B2
(45) Date of Patent: *Sep. 26, 2006

(54) ATTACHMENT PLATE FOR DIRECTLY MATING CIRCUIT BOARDS

(75) Inventors: Alisa Sandoval, Grass Valley, CA (US); Gregory S. Meyer, Rocklin, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 57 days.

This patent is subject to a terminal disclaimer.

(21) Appl. No.: 11/206,287

(22) Filed: Aug. 18, 2005

(65) Prior Publication Data

US 2006/0003608 A1  Jan. 5, 2006

Related U.S. Application Data (63) Continuation-in-part of application No. 10/653,400, filed on Sep. 2, 2003, now Pat. No. 6,951,466.

(51) Int. Cl.
*H01R 12/00* (2006.01)

(52) U.S. Cl. .......................................... 439/74; 439/73

(58) Field of Classification Search .................. 439/73, 439/74
See application file for complete search history.

(56) References Cited

U.S. PATENT DOCUMENTS 4,602,317 A  7/1986  Rovnyak et al.
4,824,379 A  4/1989  Roberts et al.
6,354,844 B1  3/2002  Coico et al.
6,547,571 B1  4/2003  Allen et al.
2002/0196614 A1  12/2002  DiBene et al.
2003/0224631 A1  12/2003  Miyashita
2004/0080921 A1  4/2004  Paola

FOREIGN PATENT DOCUMENTS

EP  1 081 994 A2  3/2001

OTHER PUBLICATIONS

GB Search Report. Application No.: GB0418140.0. Nov. 23, 2004.

*Primary Examiner*—Tho D. Ta (57) ABSTRACT

An apparatus for adjoining along a mating axis a first and second circuit board to directly mate a first integrated connector of the first board with a second integrated connector of the second board is disclosed. The apparatus comprises an attachment plate to be supported in a substantially horizontal plane; a plurality of extension arms extending downward from the plate to suspendingly restrain the first board away from the plate; at least one stop configured to be secured to the distal end of one of the plurality of extension arms to support the first board in suspension away from the plate; and a plurality of attachment elements to secure the plate to the second circuit board without applying substantial forces to the first circuit board.

19 Claims, 9 Drawing Sheets

ATTACHMENT PLATE FOR DIRECTLY MATING CIRCUIT BOARDS

CROSS-REFERENCE TO RELATED APPLICATIONS

This application is a continuation-in-part of U.S. patent application Ser. No. 10/653,400, entitled "Attachment Plate For Directly Mating Circuit Boards," filed Sep. 2, 2003, U.S. Pat. No. 6,951,466 which is hereby incorporated by reference herein.

BACKGROUND

1. Field of the Invention

The present invention relates generally to printed circuit boards and, more particularly, to an attachment plate for directly mating printed circuit boards.

2. Related Art

Computer systems have one or more printed circuit boards on which various digital and/or analog components are mounted. The principal printed circuit board in a computer system is generally referred to as a motherboard. In personal computers, the motherboard is often called the system board or mainboard. Typically, the motherboard holds many of the digital components integral to the functioning of a computer system such as the CPU, memory and basic controllers. In many instances, additional circuit boards may be attached to the motherboard to provide additional functionality. Such additional circuit boards include expansion boards and daughtercards (also referred to as daughterboards). Expansion boards are circuit boards that plug into a computer's expansion slots. Expansions boards include, for example, controller boards, LAN cards and video adapters.

Daughtercards are typically attached directly to another printed circuit board such as the noted motherboard. In contrast to expansion boards, daughtercards access the motherboard components (memory and CPU) directly rather than through a slower expansion bus. Daughtercards typically include one or more integrated connectors, commonly referred to as a socket or header, which attach to an integrated connector on the motherboard. Once the integrated connectors are mated, the boards are typically joined by screws passing through holes in each circuit board.

A mating force generated by tightening the aforementioned screws urges the circuit boards toward each other, and serves to establish and maintain the physical and electrical connection between the boards. To maintain the circuit boards in relatively parallel planes, a number of appropriately-distributed spacers are sometimes used. The height of the spacers is approximately the same as the combined height of both integrated connectors when those connectors are fully mated.

Problems can arise when directly mating circuit boards such as the noted daughtercard and motherboard. If the force applied to the connectors during mating is not parallel to the pins and sockets of the connectors; for example, if the circuit boards are not maintained in parallel planes or laterally translate during mating, damage to the connector pins and sockets can easily result. One example of such a circumstance is when one or both of the circuit boards is not planar due to manufacturing imperfections, thermal cycling or other circumstances that can cause a printed circuit board to warp or curve. In this case, rotational or other non-axial forces can be placed on connector pins and sockets during mating. Under some circumstances, this can result in the bending of pins, incomplete electrical contact between some pins and their corresponding sockets, or other types of connection failures.

SUMMARY

In one aspect of the invention, an apparatus for adjoining along a mating axis a first and second circuit board to directly mate a first integrated connector of the first board with a second integrated connector of the second board is disclosed. The apparatus comprises an attachment plate to be supported in a substantially horizontal plane; a plurality of extension arms extending downward from the plate to suspendingly restrain the first board away from the plate, wherein each extension arm comprises a recess at a distal end of the extension arm; at least one stop configured to be secured to the distal end of one of the plurality of extension arms to support the first board in suspension away from the plate, wherein the stop is configured to be secured using the recess of the extension arm; and a plurality of attachment elements to secure the plate to the second circuit board without applying substantial forces to the first circuit board.

In another aspect of the invention, an apparatus for adjoining along a mating axis a first and second circuit board to directly mate a first integrated connector of the first board with a second integrated connector of the second board is disclosed. The apparatus comprises an attachment plate to be supported in a substantially horizontal plane; a plurality of extension arms extending downward from the plate to suspendingly restrain the first board away from the plate, wherein each extension arm is comprised of a smooth elongate shaft; at least one stop configured to be secured to the distal end of one of the plurality of extension arms to support the first board in suspension away from the plate, wherein the stop is configured to secure to the extension arm by applying an inwardly directed force on the extension arm; a pressure platform extending downward from the plate to apply to the first board a mating-axis force collocated with the first connector; and a plurality of attachment elements to secure the plate to the second circuit board without applying substantial forces to the first circuit board.

In a further aspect of the invention, a method for adjoining along a mating axis a first and second circuit board to directly mate a first integrated connector of the first board with a second integrated connector of the second board is disclosed. The method comprises mounting the first circuit board on a plurality of extension arms extending from a first side of an attachment plate to suspend the first circuit board over the second circuit board with the first connector aligned with the second connector; securing at least one stop to a distal end of one of the plurality of extension arms to support the first board; and applying a mating force to a rear side of the first circuit board collocated with the first integrated connector to cause the first connector to mate with the second connector.

DETAILED DESCRIPTION

Figure 1A:
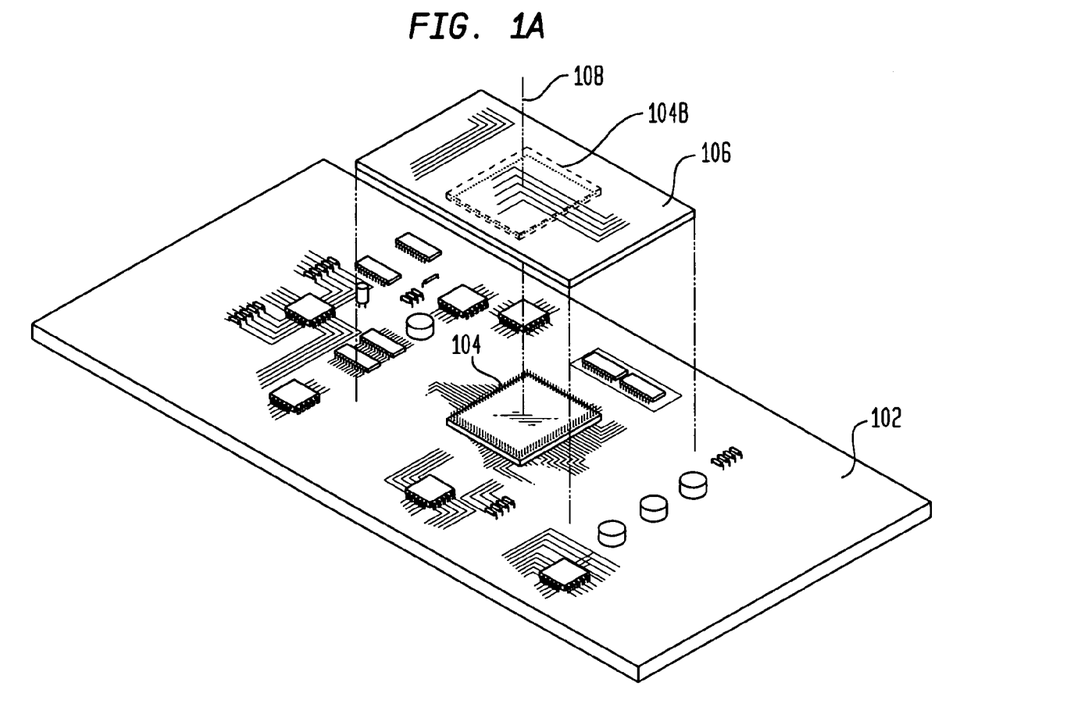
FIG. 1A is a perspective view of a conventional motherboard and daughtercard suitable for being used with the present invention.
Figure 1B:
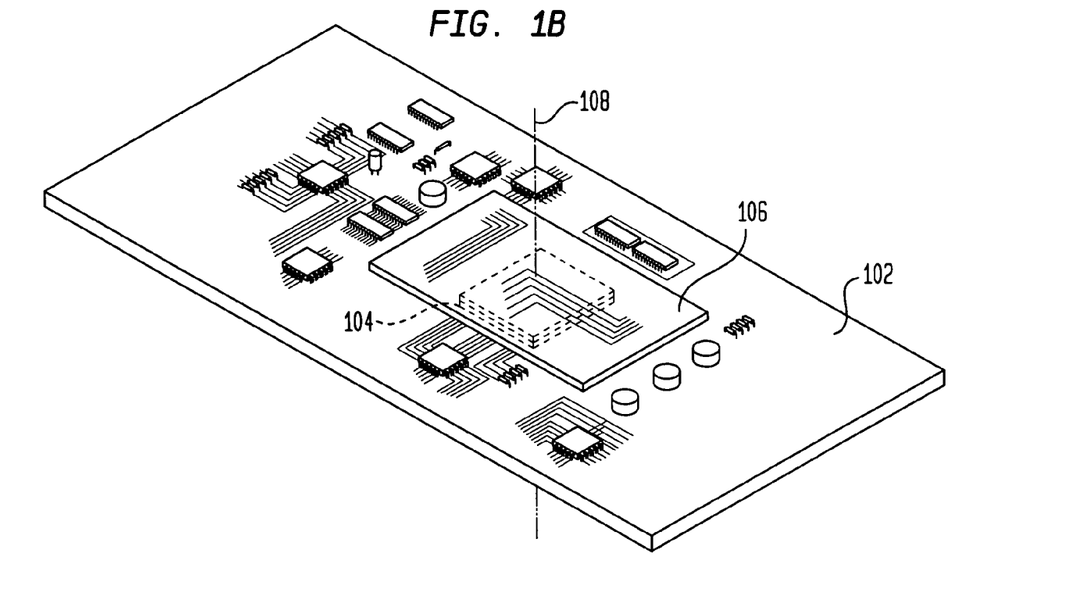
FIG. 1B is a perspective view of the motherboard and daughtercard of FIG. 1A directly mated with each other.

The present invention is directed to an apparatus for facilitating the direct electrical connection between two printed circuit boards each having an integrated electrical connector. FIGS. 1A and 1B are perspective views of two printed circuit boards, a motherboard 102 and a daughtercard 106. Motherboard 102 has an integrated electrical connector 104A. Similarly, daughtercard 106 has an integrated connector or socket 104B. Connectors 104A and 104B are corresponding halves of a conventional connector 104 such as ZIP socket, zero force insertion socket, and the like.

When daughtercard 106 and motherboard 102 are mated, they are brought together along a mating axis 108 parallel with the longitudinal axis of the pins and receptacles of connector 104, as shown in FIG. 1B. A force substantially parallel with mating axis 108 (referred to as a mating axis force) is then applied to daughtercard 106 to urge the daughtercard toward motherboard 102. Such mating axis forces cause the electrical and physical connection of the two integrated connectors 104A, 104B. Thereafter, daughtercard 106 is directly connected to motherboard 102; that is, connectors 104A and 104B are connected to each other with no intervening cables, wires or the like.

As noted, when mating daughtercard 106 and motherboard 102, rotational forces and translational forces that are not parallel to the mating axis (collectively referred to as non-mating axis forces) can damage connector pins or fracture traces or other electrical connections on the printed circuit boards 102, 106, thereby reducing the reliability of the resulting assembly. For example, conventional daughtercards are typically mated directly to a motherboard with attachment screws located at the four corners of the daughtercard. Due to the lack of planarity of the daughtercard or the variability with which the attachment screws are adjusted, the applied mating forces can cause the printed circuit boards to bend, rotate, etc., causing stresses in the boards.

Generally, the present invention is an attachment plate system that prevents non-mating axis forces from being applied to the integrated connectors of a mating motherboard and daughtercard. The invention physically suspends the daughtercard over the motherboard to allow the proper alignment of the integrated connectors to dictate the relative position of the printed circuit boards, and, preferably, to allow at least a partial mating of the connectors to occur before securing the printed circuit boards together. Any additional forces such as mating axis forces applied to further mate the connectors and/or to join the printed circuit boards, are applied solely to the attachment plate and not the suspended daughtercard. Such forces are transferred to a localized region of the suspended daughtercard immediately behind and collocated with the daughtercard's integrated connector, preventing the daughtercard from translating and rotating in response to such applied forces, other than to translate along the mating axis. Thus, variations in daughtercard tolerances, variability in operator mating technique, etc., do not cause internal stresses in the daughtercard which can damage the daughtercard connector, printed circuit board or components and connections on the printed circuit board.

Figure 2:
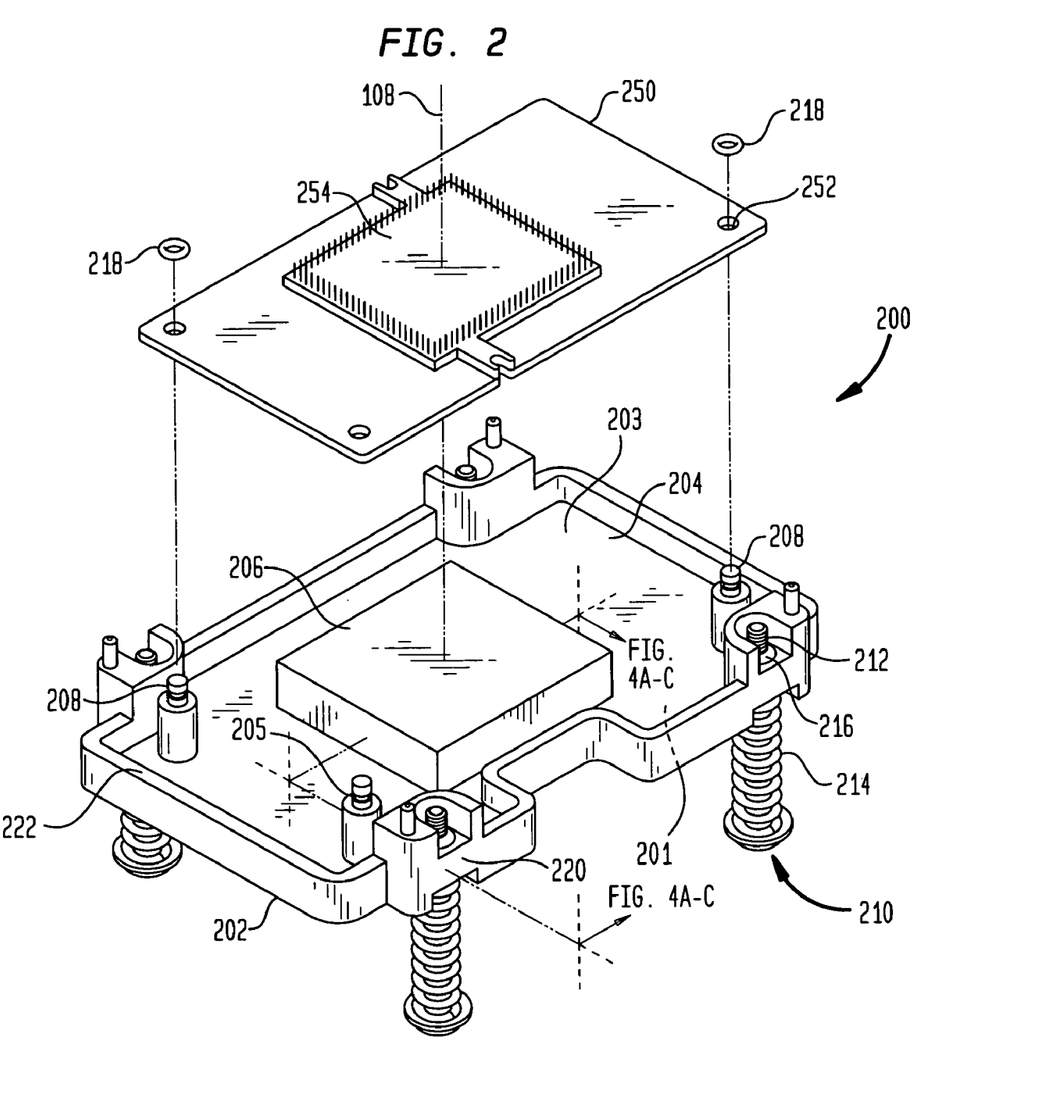
FIG. 2 is a perspective view of one embodiment of an attachment plate of the present invention, showing how the attachment plate is coupled to a daughtercard.
Figure 3:
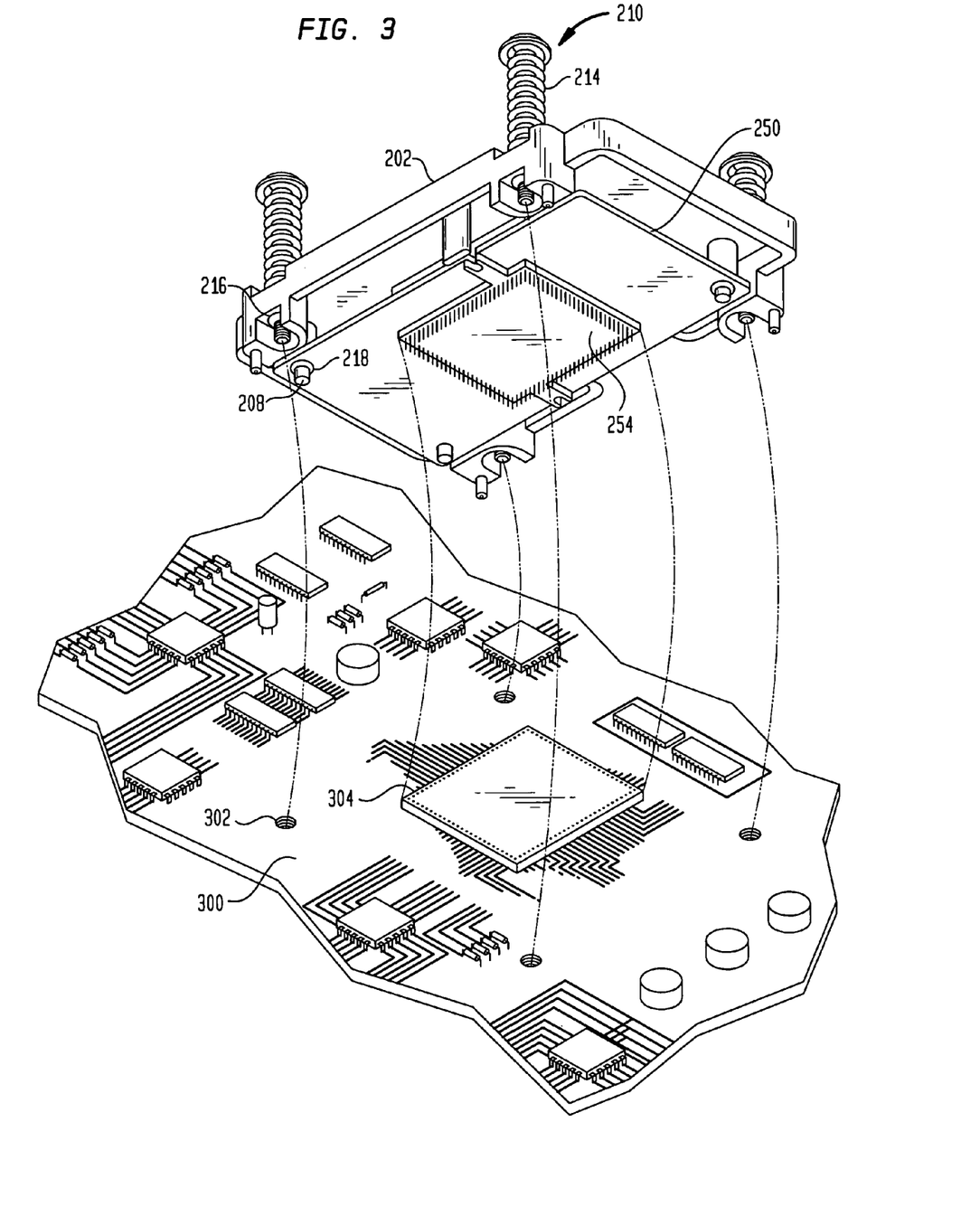
FIG. 3 is a perspective view of one embodiment of the attachment plate shown in FIG. 2, showing how the attachment plate is used to connect the daughtercard shown in FIG. 2 to a motherboard.

In the following description, embodiments of the attachment plate assembly will be described with reference to FIGS. 2 and 3. Then, use of the attachment plate assembly will be described with reference to the cross-sectional views of FIGS. 4A through 4C. FIGS. 2 and 3 are perspective views of one embodiment of an attachment plate assembly of the present invention. In FIG. 2, the attachment plate assembly is illustrated upside-down to show how the attachment plate system can receive a printed circuit board such as a daughtercard. FIG. 3 is a perspective view of the attachment plate shown in FIG. 2 rotated to mate the daughtercard suspended thereon to a motherboard.

Generally, attachment plate assembly 200 comprises an attachment plate 202 configured to retain a daughtercard 250 with a rear side of the daughtercard facing attachment plate 202 and a top side of the daughtercard exposed for mating to a motherboard (not shown). In the embodiment shown in FIGS. 2 and 3, attachment plate 202 has a rear side 201 and a mating side 203 with a raised edge or sidewall 222 defining a shallow bay 204. All components of attachment plate assembly 200 are coupled to attachment plate 202.

Integrated on mating surface 203 of attachment plate 202 are a plurality of extension arms 208 configured to restrain daughtercard 250 in a generally fixed position relative to attachment plate 202, and to provide limited relative movement of daughtercard 250 substantially parallel to mating axis 108. Mating axis 108 is parallel to the longitudinal axis of the pins and receptacles of connectors 254 and 302, and travels through the center of the connectors. Daughtercard 250 includes holes 252 adapted to receive extension arms 208 as described below. In the orientation of attachment plate system 200 shown in FIG. 2, daughtercard 250 is placed on extension arms 208 causing each extension arm 208 to pass through a corresponding hole 252 in daughtercard 250.

It should be understood that extension arms 208 preferably have a diameter that allows for a close fit within daughtercard holes 252. Such a close fit restricts rotation and lateral translation of daughtercard 250 relative to attachment plate 202. After daughtercard 250 is mounted on extension arms 208, o-rings 218 are attached to the extension arms as shown in FIG. 2. When attachment plate 202 is rotated into the proper orientation to mate daughtercard 250 with a motherboard, as shown in FIG. 3, daughtercard 250 will shift away from attachment plate 202 to come to rest against o-rings 218 in a position on extension arms 208 suspended away from attachment plate 202. This is described in detail below.

A raised pressure plate 206 is provided on mating side 203 of attachment plate 202. In one preferred embodiment pressure plate 206 has approximately the same cross-sectional area and, more preferably, approximately the same cross-sectional dimensions as connector 254.

Pressure plate 206 is centered on mating axis 108 to be collocated with connector 254 when daughtercard 250 is mounted on attachment plate 202. Importantly, pressure plate 206 is the forward-most contacting surface on attachment plate 202. As such, pressure plate 250 is the only portion of attachment plate 202 that applies a force to daughtercard 250 when attachment plate 202 is secured to motherboard 300 (shown in FIG. 3). More specifically and as will be described in detail below, attachment plate 202 transfers mating forces applied to attachment plate 202 to pressure plate 206 which in turn transfers the applied mating forces to the rear side of daughtercard 250 behind connector 254. Because pressure platform 206 has approximately the same cross-sectional area as connector 254, the applied mating forces are distributed evenly across the connector.

Attachment plate 202 has a plurality of attachment screw/spring assemblies 210 for securing the attachment plate directly or indirectly to the motherboard. Attachment screw/spring assemblies 210 include an attachment screw 212 surrounded by an attachment spring 214. As is well know in the art, motherboard 300 includes corresponding threaded holes 302 for receiving screws such as attachment screws 212. Alternatively, motherboard 300 can be mounted on a plate or other support structure that includes such corresponding threaded holes 302.

Attachment screw/spring assemblies 210 are distributed around daughtercard 250 and oriented parallel to mating axis 108. When connector 254 is aligned with an integrated connector 304 on motherboard 300, attachment screws 212 are aligned with a corresponding threaded hole 302 in the motherboard. Preferably, attachment screw/spring assemblies 210 are symmetrically distributed around connector 254. In the illustrated embodiment, four attachment screw/spring assemblies 210 are shown located at each of the four corners of attachment plate 202.

As shown in FIGS. 2 and 3, attachment screw/spring assemblies 210 are positioned on rear side 201 of attachment plate 202, with each attachment screw 212 extending through a hole in the attachment plate. Springs 214 are compressed between attachment plate 202 and the head of a corresponding attachment screw 212. Spring 214 of each attachment screw/spring assembly 210 provides a biasing force on its associated screw 212 to urge screw 212 toward an unengaged position; that is, to prevent it from falling through attachment plate 202 when the plate is rotated into the mating orientation shown in FIG. 3. Each attachment screw/spring assembly 210 is coupled to attachment plate 202 by a snap ring or c-clip 216 on mating side 203 of attachment plate 202. Each screw 212 has an undercut (not shown) that operates with snap ring 216 to prevent screw 212 falling from attachment plate 202 when the plate is in the position shown in FIG. 2. In contrast to conventional attachment screws which apply mating forces directly to the daughtercard, attachment screws 212 apply a mating axis force to attachment plate 202 which translates the mating forces to connector 254 via pressure plate 206, as noted above and described in detail below. Because daughtercard 250 is not in contact with attachment plate 202 at the vicinity of attachment screws 212, and because the attachment screws are coupled to the plate rather the daughtercard, the mating forces applied by the attachment screws cannot cause any tolerance stack on any of the four corners of the daughtercard.

Figure 4A:
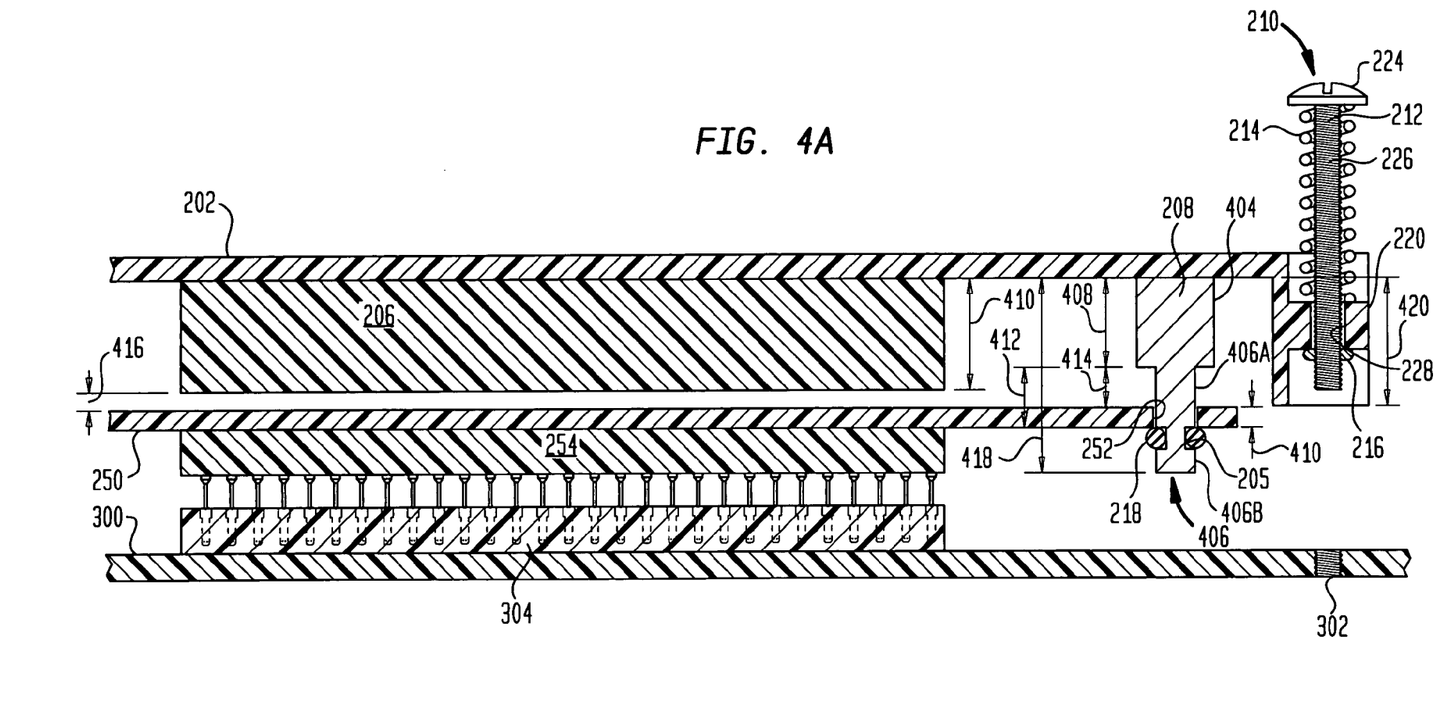
FIGS. 4A–4C are three cross-sectional views showing the mating of the daughtercard and motherboard of FIG. 3.
Figure 4B:
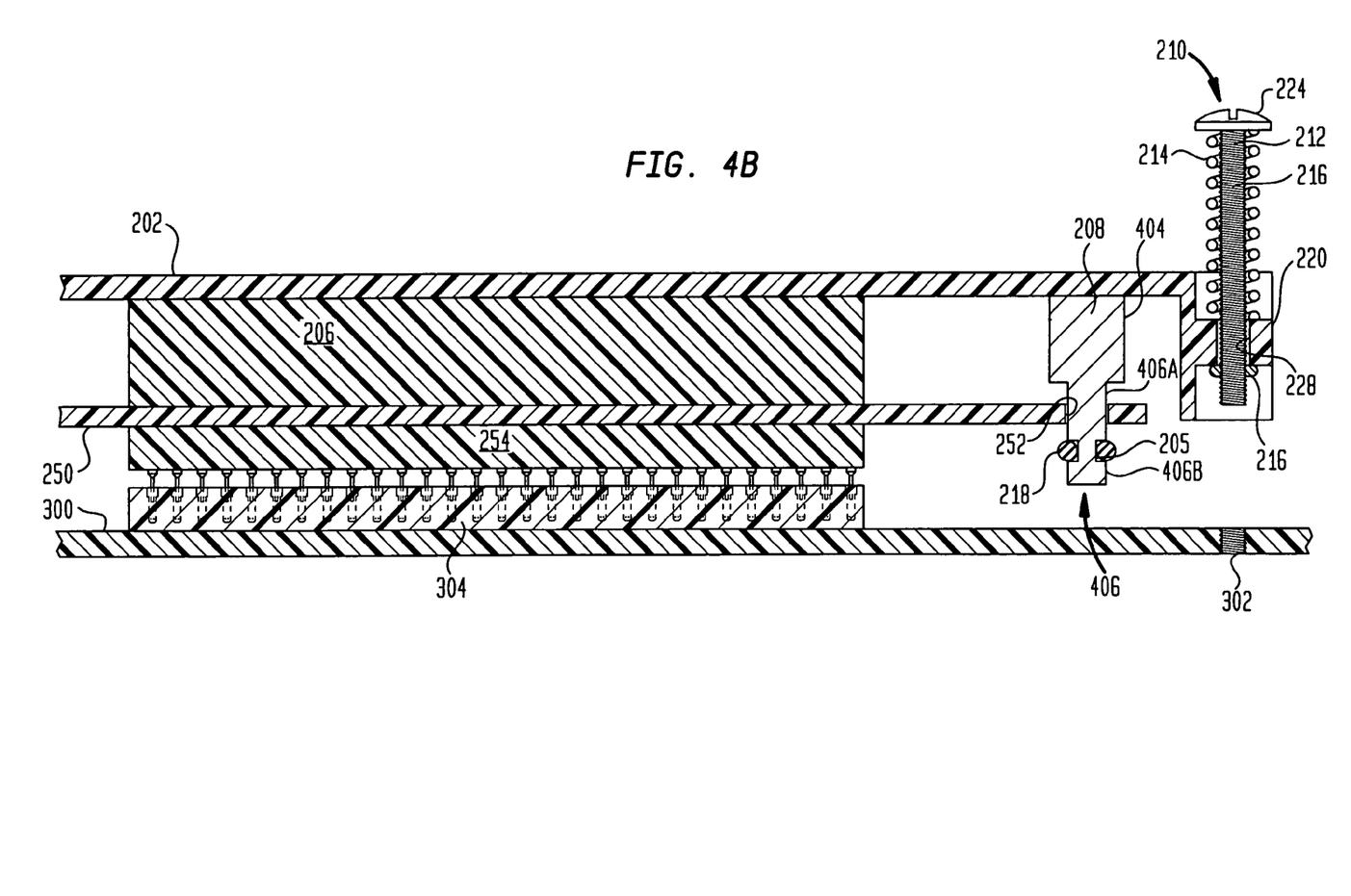
Figure 4C:
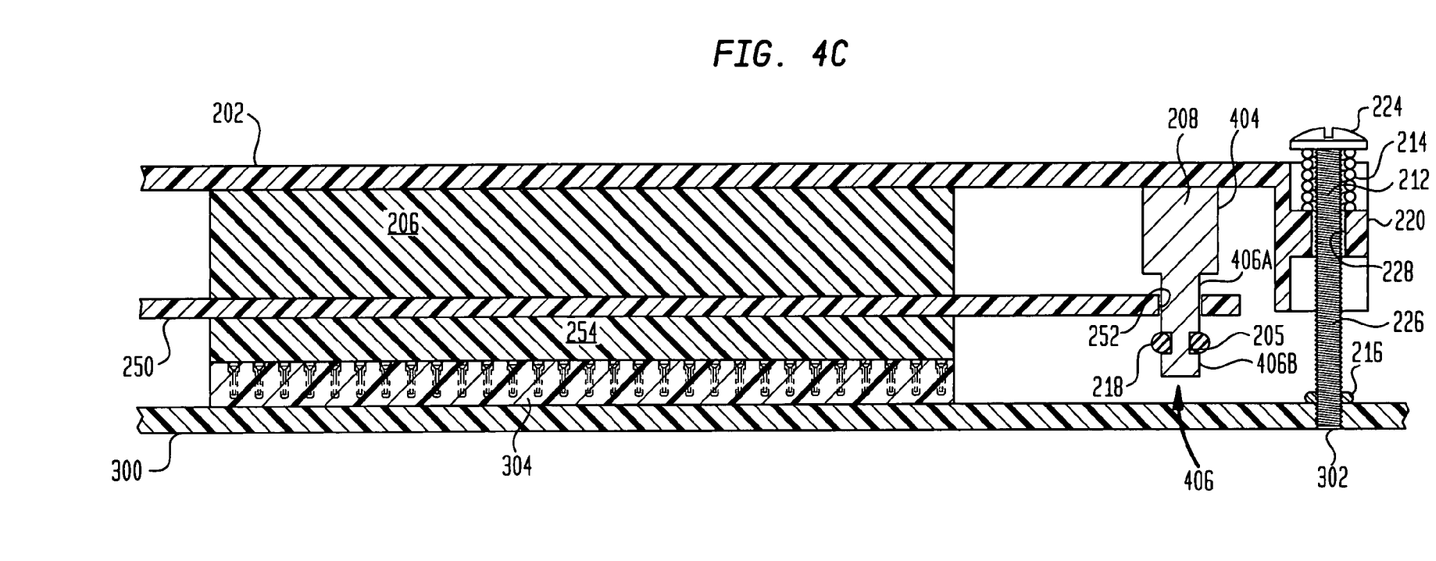

The operation of the illustrative embodiment of attachment plate system 200 will now be described with reference to FIGS. 4A–4C. FIGS. 4A–4C are three cross-sectional views of daughtercard 250 and motherboard 300. FIG. 4A shows the two printed circuit boards as they are initially brought into contact with each other. FIG. 4B shows the two connectors 254, 302 partially mated, for example, under the weight of daughtercard 250. FIG. 4C shows the two connectors 254, 302 fully mated in response to a mating force applied through attachment plate 202. It should be understood that in the cross-sectional views illustrated in FIGS. 4A–4C attachment plate assembly 200 is oriented as shown in FIG. 3; that is, in the "mating" orientation. It should also be appreciated that in FIGS. 4A–4C only certain portions of attachment plate assembly 200 are illustrated; primarily, pressure platform 206, extension arms 208 and attachment screw/spring assembly 210, as defined by section line "FIGS. 4A–C" shown in FIG. 2.

Referring now to FIG. 4A, the relevant dimensions of these particular components is first described. In operation, after daughtercard 250 is mounted on attachment plate 202, the attachment plate is turned over as shown in FIG. 3, and daughtercard connector 254 is aligned with motherboard connector 304. The position of daughtercard 250 on attachment plate 202 when oriented for mating is shown in FIG. 4A. As shown there, when rotated, daughtercard 250 travels downward on extension arms 208 to rest on compliant stops 218. In this position, there is a gap between pressure platform 206 and daughtercard 250.

In one embodiment, extension arms 208 are formed with a standoff 404 defined by a larger diameter than an upper post 406 of the extension arms. Upper post 406 has a recessed 205 for receiving compliant stop 218. Standoff 404 has a height 408 that is less than height 410 of pressure plate 206. Upper post 406 is comprises of post regions 406A and 406B with recess 205 interposed between the two post regions 406. Post regions 406A and 406B have a diameter that is no larger than the diameter of daughtercard hole 252. Preferably, at least lower post region 406A has a diameter that allows for a close fit within hole 252 to provide positional stability of daughtercard 250 with respect to attachment plate 200 to prevent rotation and lateral translation of the daughtercard when it is engaged with lower post 406A.

Recess 205 accepts an correspondingly configured o-ring 218. Preferably, the diameter of o-ring 218, upper post 406B and recess 205 have relative dimensions that requires o-ring 218 to be slightly expanded to slide or roll over post region 406B until o-ring 218 reaches recess 205. Recess 205 allows o-ring 218 to contract to a smaller diameter to securely fit within the recess. The outside diameter of o-ring 218 is greater than the diameter of hole 252, enabling o-ring 218 to provide a support surface for the suspended daughtercard 250. It should be appreciated that other compliant and non-compliant stops other than o-ring 218 can be used. Preferably, such stops do not require the use of additional tools. However, a person of ordinarily skill in the art will recognize that a variety of different retaining hardware such as a c-clip, snap ring, or cap can be used to facilitate the function of stop 218.

The height 412 of lower post region 406A is greater than thickness 410 of daughtercard 250. When daughtercard 250 rests against o-ring 218, there is a gap 414 between the daughtercard and the post standoff 404. Gap 414 is greater than gap 416 between pressure plate 206 and daughtercard 250, as shown in FIG. 4A. When suspended in this position, daughtercard 250 is held in a generally fixed position relative to attachment plate 202 with limited movement parallel to mating axis 108. That is, daughtercard 250 is free to move along mating axis 108 on extension arms 208, while movement along other axes and rotation with respect to attachment plate 202 is restricted. Distance 416 defines the amount of limited axial movement of daughtercard 250. In one embodiment, distance 416 is approximately 0.4 mm. In the illustrative embodiment, the combination of distance 416 and the resilience of o-ring 216 provides daughtercard 250 with the capability of traveling up to 0.8 mm along mating axis 108. It should be apparent to those of ordinary skill in the art that other distances can be implemented in other embodiments.

The operation of mating daughtercard 250 and motherboard 300 will now be described with reference to FIGS. 4A–4C. As noted, FIG. 4A shows the two printed circuit boards 250, 300 as they are initially brought into contact with each other. As shown in FIG. 4A, connector halves 254, 304 are the first surfaces to contact each other. Height 418 of extension arm 208 and height 420 of attachment screw housing 226 are such that neither element contacts motherboard 300 prior to connector 254 contacting connector 304. Thus, connectors 254, 304 are first aligned with each other in the absence of an influence of other elements of attachment plate 202 and daughtercard 250 coming into contact with motherboard 300.

In addition, as noted above, attachment springs 214 are compressed and interposed between the head of screws 212 and attachment plate 202 to bias attachment screws 212 toward an unengaged position. By biasing attachment screws 212 away from their attachment position, the attachment screws are prevented from extending toward and contacting motherboard 300 before the mating of connectors 254, 304. Thus, the alignment between the printed circuit boards 250, 300 and connectors 254, 304 is dictated solely by the connectors, not the initial engagement of attachment screws 212.

Referring now to FIG. 4B, attachment plate 202 has been lowered further from the position shown in FIG. 4A. In the particular embodiment shown, connectors 254, 302 have partially mated, for example, under the weight of daughtercard 250. It should be appreciated that connectors 254, 304 may or may not partially or completely mate under the weight of daughtercard 250 depending on the weight of the card and the type of connectors.

As attachment plate assembly 200 is lowered, extension arm 208 travels through opening 252 until pressure plate 206 encounters the rear side of daughtercard 250.

Subsequent to some initial potential mating, daughtercard 250 is no longer supported by stops 218; rather, the daughtercard is supported by the resistance of connectors 254, 304 to further mating. In the illustration of FIG. 4B, attachment plate 202 has been lowered until pressure platform 206 has made initial contact with the rear side of printed circuit board 250.

Further mating of daughtercard 250 and motherboard 300 occurs in response to securing attachment plate 202 to motherboard 300. In FIG. 4C, attachment plate 202 is secured to motherboard 300 via attachment screws 212. As noted, attachment screws 212 are one component of attachment screw/spring assemblies 210. To cause attachment screws 212 to engage threaded holes 302 in motherboard 300, a manual force parallel to mating axis 108 is applied to the head of attachment screw 212, such as with a screwdriver. The applied force causes springs 214 to compress and attachment screw 212 to extend toward motherboard 300. Rotation of attachment screw 212 causes the screw to further engage threaded hole 302, causing the further mating of connectors 254, 304. As attachment screws 212 are each rotated, they apply a mating force to attachment plate 202. Since the only portion of attachment plate 200 that is in contact with daughtercard 250 is pressure platform 206 collocated with connector 254, and not extension arms 208 at the corners of daughtercard 250, all such applied mating forces are applied to daughtercard 250 through pressure platform 206. This internal attachment of daughtercard 250 to pressure platform 206 prevents variations in the threading of attachment screws 212 and variations in the planarity of daughtercard 250 from causing rotational or other non-mating axis forces to be applied to connectors 254, 304.

Once daughtercard 250 and motherboard 300 are mated, and attachment plate 202 is attached to motherboard 300, the two circuit cards are maintained in a stable relative position by attachment screw/spring assembly 210. Compressed springs 214 and the threaded mating of screws 212 and motherboard 300 maintain daughtercard 250 and motherboard 300 in a fixed relative position. This maintains the integrity of the electrical connection between connectors 254, 304 when the circuit cards 250, 300 undergo thermal expansion and compression cycles during the operational life of the mated components. Oftentimes the components and connectors expand and contract at different rates and to different extents. Such thermal cycles can cause unintended fracturing or separation adversely affecting the reliability of the electrical connection between such components.

As discussed above in the embodiment illustrated in FIG. 2, recess 205 allows o-ring 218 to contract to a smaller diameter to securely fit within the recess. In this and other embodiments, the depth of recess 205 may vary. For example, recess 205 may be very deep relative to the thickness of o-ring 218 or recess 205 may be very shallow. Or, in other embodiments, extension arms 208 may not include a recess. A deep recess 205 may be used in situations where it is desirable for o-ring 218, or other retaining hardware (e.g., c-clip, snap ring, or cap) to more securely attach to extension arm 208. A shallow recess, however, may be used in situations where it is desirable for o-ring 218 or other retaining hardware to more easily slide off of extension arm 208. O-ring 218 (or other retaining hardware) may, for example, be manufactured using any suitable materials, such as, for example, a plastic, such as, a neoprene, polypropylene, a polycarbonate, a polycarbonate blend, etc.

Figure 5:
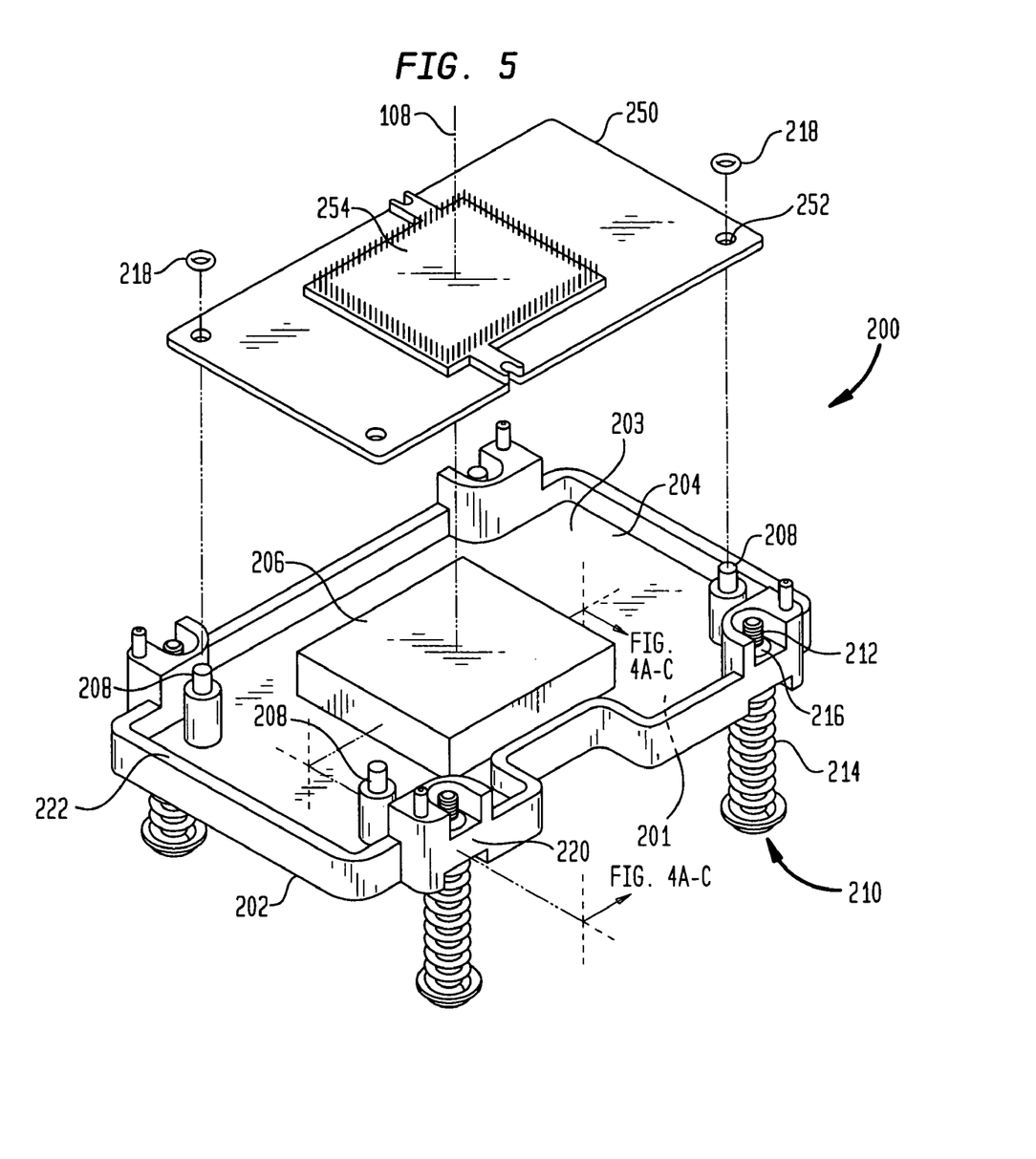
FIG. 5 provides a perspective view of an embodiment of an attachment plate, showing how the attachment plate is coupled to a daughterboard.

FIG. 5 provides a perspective view of an embodiment of an attachment plate, showing how the attachment plate is coupled to a daughtercard. FIG. 5 is identical to FIG. 2 with the exception that in this embodiment, extension arms 208 do not include a recess, but instead have a smooth surface. An embodiment, such as illustrated in FIG. 5 may be used in situations where, for example, it is desirable for o-rings 218 to be removed after mating of the daughterboard and motherboard. By using smooth extension arms 208, o-rings 218 may be more easily detached.

In embodiment such as illustrated in FIG. 5, o-ring 218 or other suitable retaining hardware may have an interior diameter slightly smaller than the diameter of extension arm 208. O-ring 218 may then be attached to the extension arm by slightly expanding o-ring 218 and sliding it over extension arm 208. O-ring 218 may then contract and exert an inwardly-directed force on extension arm 208 to secure the o-ring in place. In such an embodiment, o-ring 218 may have various interior diameters and be made of various materials to ensure that a desirable inward force is applied. For example, where a more secure attachment is desirable (i.e., a greater inward force), o-ring 218 may have a smaller diameter and/or be made of a material having a stronger elasticity. Or, where it is desirable to have an o-ring 218 that can more easily slide off/on extension arm 208, o-ring 218 may have a larger diameter and/or be manufactured with a material having a lower modulus of elasticity. For example, it may be desirable in certain embodiments to remove attachment plate 202 after mating of the daughtercard 250 to the motherboard 300. In such an embodiment, after mating, attachment plate 202 may be removed by, for example, unscrewing attachment screws 212 and lifting up on attachment plate 202 causing o-rings 218 to slide off extension arms 208. In such an embodiment, o-rings 218 preferably have a diameter and elasticity that allows them to easily slide off extension arms 208 so that connectors 254 and 304 remain mated after removal of attachment plate 202.

Figure 6:
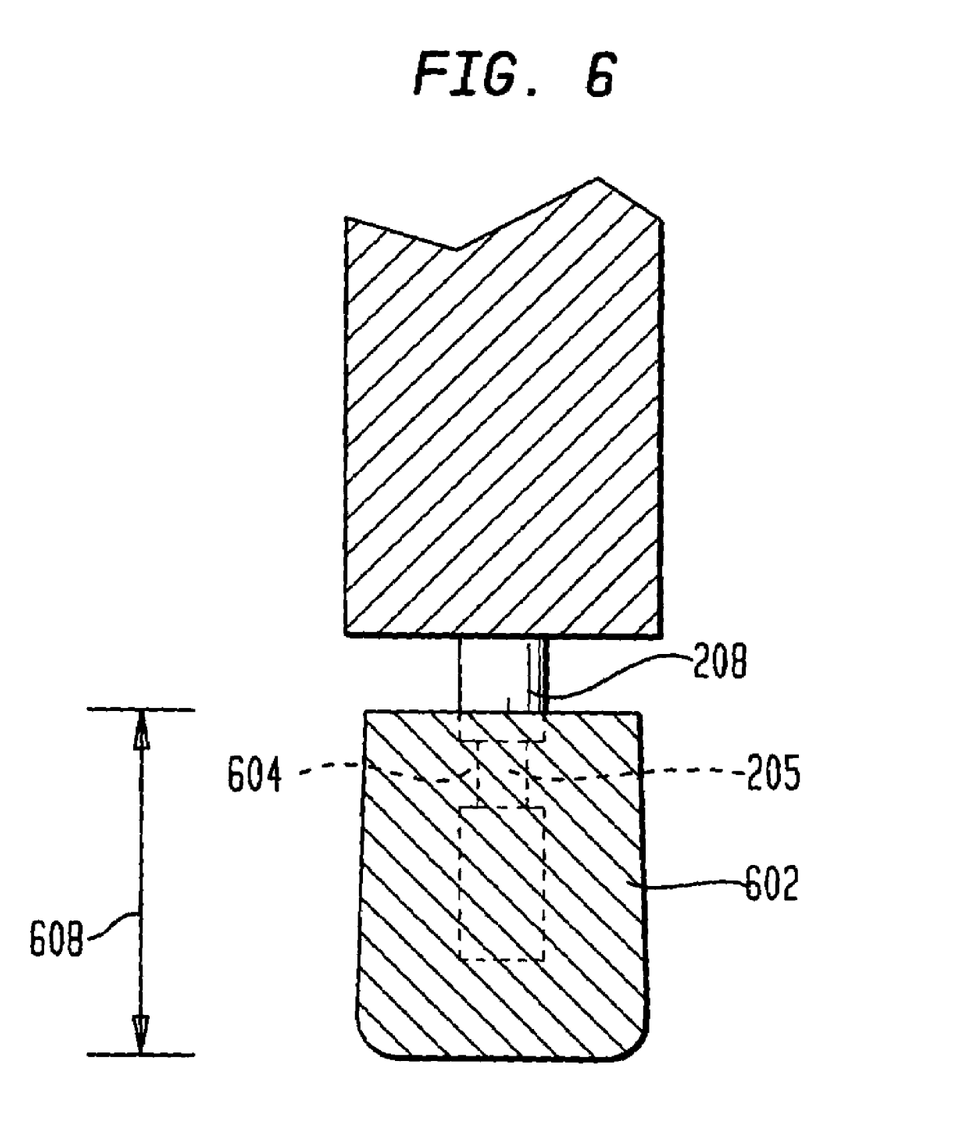
FIG. 6 illustrates an exemplary cap for use in some embodiments of the present invention.
Figure 7:
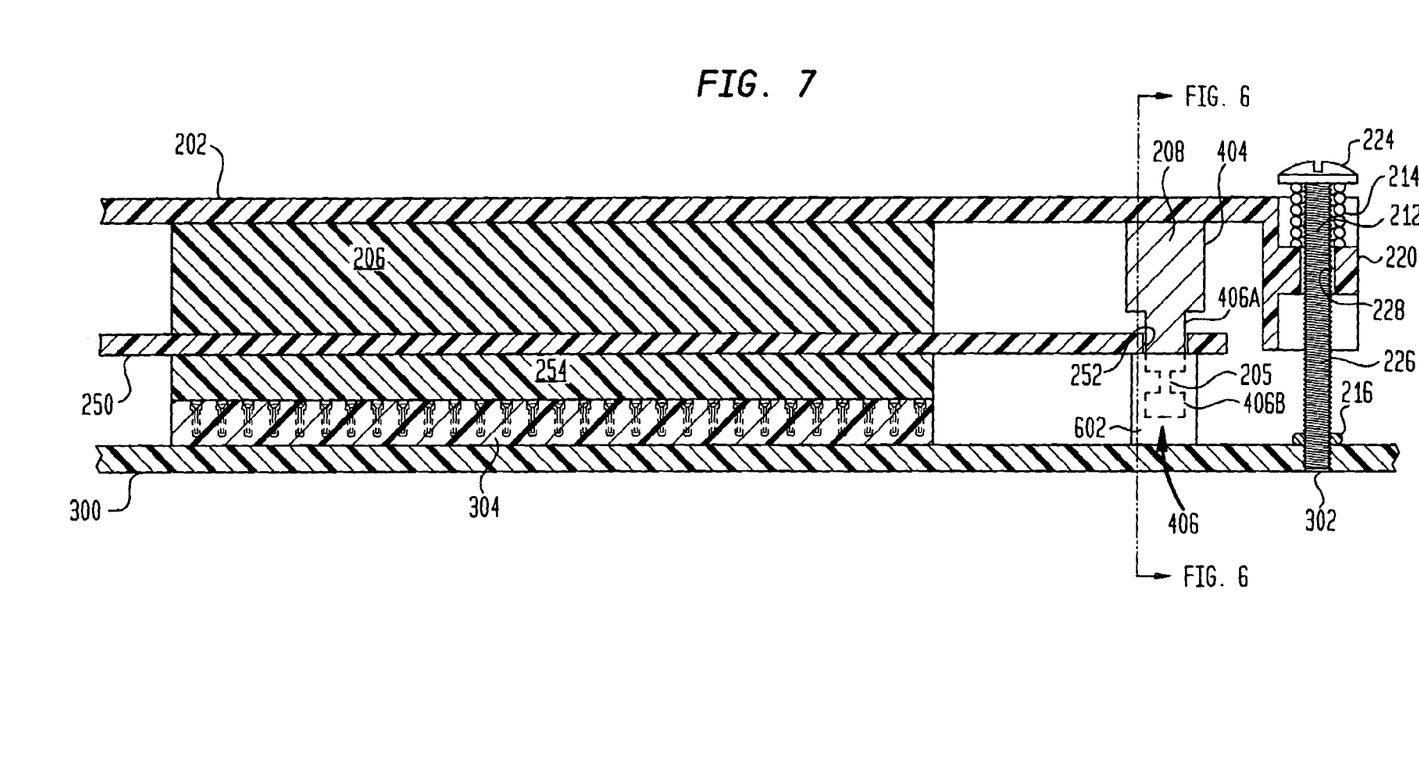
FIG. 7 illustrates an exemplary embodiment of a mated daughter card and motherboard using one embodiment of the caps illustrated in FIG. 6.

In alternative embodiments, retaining hardware or "stops" other than -o-rings may be used. For example, in one embodiment retaining hardware such as, for example, c-clips, snap rings, or caps are utilized to suspend daughtercard 250 on extension arms 208. FIG. 6 illustrates an exemplary cap for use in certain embodiments of the present invention. FIG. 7 illustrates an exemplary embodiment of a mated daughtercard 250 and motherboard 300 using caps 602. The view shown in FIG. 6 is taken along the section line illustrated in FIG. 7.

As illustrated, cap 602 may be secured to the distal end of extension arm 208. A protrusion 604 on the interior surface of cap 602 may traverse at least a portion, and preferably the entire circumference of the interior cavity of cap 602 such that when slid over extension arm 208, ridge 604 fits into recess 205 of extension arm 208 to secure cap 602 to extension arm 208. Cap 602 may be made of any suitable material, such as, for example, a plastic. This plastic may be formed from any appropriate material such as, for example, a neoprene, polypropylene, a polycarbonate and/or a polycarbonate blend. Further, for example, cap 602 material may be such that when slid over extension arm 208, the interior cavity of cap 602 is expanded, such that when ridge 604 slides over recess 205, cap 602 may contract to a smaller diameter such that ridge 604 securely fits in recess 205. The height 608 of cap 602 may also vary for different embodiments.

FIG. 7 illustrates an exemplary embodiment of a mated daughtercard 250 and motherboard 300 using caps 602. FIG. 7 is identical to previously discussed FIG. 4C with the exception that caps 602 are utilized to perform two functions: to suspendingly retain daughtercard 250 on extension arms 208, and to serve as a spacer to prevent mating forces generated by attachment screws 212 from flexing motherboard 300 toward attachment plate 202 or from twisting motherboard 300 so as to adversely affect the physical and electrical connection between daughtercard 250 and motherboard 300. In the embodiment shown in FIG. 7, caps 602 serve as spacers between daughtercard 250 and motherboard 300, as described below. When cap 602 is secured to extension arm 208 the combined length of the cap and extension arm is approximately the same as the combined thickness or height of integrated connectors 254, 304, pressure plate 206 and daughtercard 250 when connectors 354, 304 are fully mated.

As shown, cap 602 is fitted over post region 406B of extension arm 208. The uppermost post regions 406A and 406B (and recess 205 located therebetween) of extension arm 208 are illustrated as a dotted lines because when cap 602 is fitted over extension arm 208, these portions of extension arm 208 are located within the interior cavity of cap 602. Further, in this embodiment, cap 602 has a height such that when installed on extension arm 208 and daughtercard 250 is mated with motherboard 300, cap 602 contacts motherboard 300. That is, cap 602 has a height such that it fills up the gap between daughtercard 250 and motherboard 300 when their respective connectors 254, 304 are fully mated.

As noted, when cap 602 is secured to extension arm 208 the combined length of the cap and extension arm is approximately the same as the combined thickness or height of integrated connectors 254, 304, pressure plate 206 and daughtercard 250 when connectors 254, 304 are fully mated. Should attachment screws 212 be over tightened (or other forces are exerted on motherboard 300), the capped extension arms 202 may help support some of this force to relieve excess forces being applied to motherboard 300 and connectors 254 and 304.

In certain embodiments, cap 602 may also be manufactured so that after mating of daughtercard 250 and motherboard 300, the height 608 of cap 602 is such that the cap is in contact with motherboard 300 and daughtercard 250. In such an embodiment, cap 602 may also help relieve mating axis forces applied to daughtercard 250.

While various embodiments of the present invention have been described above, it should be understood that they have been presented by way of example only, and not limitation. For example, pressure platform 206 can be fabricated as part of attachment plate 202 or it may be subsequently attached to the plate 202 after the attachment plate is fabricated. The ability to attach pressure platform 206 to attachment plate 202 after the attachment plate is fabricated allows the user to interchange various size pressure platforms to correspond to various size connectors 254. As another example, in the embodiment of attachment plate assembly 200 described above, attachment plate 202 includes a sidewall 222 that defines a shallow bay 204. It should be appreciated, however, that such a sidewall is not necessary. In alternative embodiments, for example, attachment plate 200 does not include such a sidewall. As a further example, in the embodiment illustrated in FIG. 2, three extension arms 208 and two o-rings 218 are used to suspendingly secure daughter card 250 to attachment plate 202. However as one of ordinary skill in the art will find apparent, in alternative embodiments different quantities and combinations of extension arms 208 and o-rings 218 can be implemented. As a further example, in an alternative embodiment, apertures 228 are threaded to retain screws 212 in attachment plate 202, eliminating the need for springs 214 and clips 216 while requiring rotations of screws 212 to bring screws 212 into engagement with threaded holes 302 on motherboard 300. Thus, the breadth and scope of the present invention should not be limited by any of the above-described exemplary embodiments, but should be defined only in accordance with the following claims and their equivalents.

What is claimed is:

1. An apparatus for adjoining along a mating axis a first and second circuit board to directly mate a first integrated connector of the first board with a second integrated connector of the second board, comprising:
   an attachment plate to be supported in a substantially horizontal plane;
   a plurality of extension arms extending downward from the plate to suspendingly restrain the first board away from the plate, wherein each extension arm includes a recess at a distal end of the extension arm;
   at least one stop configured to be secured to the distal end of one of the plurality of extension arms to support the first board in suspension away from the plate, wherein the stop is configured to be secured using the recess of the extension arm; and
   a plurality of attachment elements to secure the plate to the second circuit board without applying substantial forces to the first circuit board.

2. The apparatus of claim 1, wherein the stop is a cap configured to fit over the distal end of the extension arm; and wherein the cap includes a ridge configured to snap into the recess of the extension arm to secure the cap on the extension arm.

3. The apparatus of claim 2, wherein the cap is further configured to, after adjoining of the first and second circuit boards, contact the second board to support a mating-axis force.

4. The apparatus of claim 3, wherein the cap is plastic.

5. The apparatus of claim 4, wherein the cap is manufactured from one or more of the following: neoprene, polypropylene, a polycarbonate and a polycarbonate blend.

6. The apparatus of claim 1, wherein the stop is an o-ring.

7. The apparatus of claim 6, wherein the o-ring is manufactured from one or more of the following: neoprene, polypropylene, a polycarbonate and a polycarbonate blend.

8. An apparatus for adjoining along a mating axis a first and second circuit board to directly mate a first integrated connector of the first board with a second integrated connector of the second board, comprising:
    an attachment plate to be supported in a substantially horizontal plane;
    a plurality of extension arms extending downward from the plate to suspendingly restrain the first board away from the plate, wherein each extension arm is comprised of a smooth elongate shaft;
    at least one stop configured to be secured to the distal end of one of the plurality of extension arms to support the first board in suspension away from the plate, wherein the stop is configured to secure to the extension arm by applying an inwardly directed force on the extension arm;
        a pressure platform extending downward from the plate to apply to the first board a mating-axis force collocated with the first connector; and
    a plurality of attachment elements to secure the plate to the second circuit board without applying substantial forces to the first circuit board.

9. The apparatus of claim 8, wherein the stop is an o-ring.

10. The apparatus of claim 9, wherein the o-ring is manufactured from one or more of the following: neoprene, polypropylene, a polycarbonate and a polycarbonate blend.

11. A method for adjoining along a mating axis a first and second circuit board to directly mate a first integrated connector of the first board with a second integrated connector of the second board, comprising:
    mounting the first circuit board on a plurality of extension arms extending from a first side of an attachment plate to suspend the first circuit board over the second circuit board with the first connector aligned with the second connector;
    securing at least one stop to a distal end of one of the plurality of extension arms to support the first board; and
    applying a mating force to a rear side of the first circuit board collocated with the first integrated connector to cause the first connector to mate with the second connector.

12. The method of claim 11, wherein at least one of the stops is a cap and wherein securing at least one stop comprises:
    fitting at least one cap over the distal end of the extension arm, wherein the cap includes a ridge configured to snap into a recess of the extension arm to secure the cap on the extension arm.

13. The method of claim 12, wherein after adjoining the first and second circuit boards, the at least one cap contacts the second board to support a mating-axis force.

14. The method of claim 12, wherein the cap is manufactured from a plastic.

15. The method of claim 12, wherein the cap is manufactured from one or more of the following: neoprene, polypropylene, a polycarbonate and a polycarbonate blend.

16. The method of claim 11, wherein the stop is an o-ring.

17. The method of claim 16, wherein the o-ring is manufactured from one or more of the following: neoprene, polypropylene, a polycarbonate and a polycarbonate blend.

18. The method of claim 16, wherein the elongated shaft includes a recess at the distal end of the elongated shaft, and wherein the securing at least one stop comprises securing the O-ring by fitting the O-ring at least partially in the recess.

19. The method of claim 16, wherein the elongated shaft comprises a smooth elongate shaft, and wherein the O-ring is secured to the extension arm by the O-ring applying an inwardly directed force on the extension arm.

* * * * *